US 8,040,749 B2

(12) United States Patent
Chen et al.

(10) Patent No.: US 8,040,749 B2
(45) Date of Patent: Oct. 18, 2011

(54) FLASH MEMORY CONTROLLER UTILIZING MULTIPLE VOLTAGES AND A METHOD OF USE

(75) Inventors: Ben Wei Chen, Fremont, CA (US); David Hong-Dien Chen, Irvine, CA (US); David Sun, Fountain Valley, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 12/824,754

(22) Filed: Jun. 28, 2010

(65) Prior Publication Data

US 2010/0268873 A1    Oct. 21, 2010

Related U.S. Application Data

(62) Division of application No. 11/937,451, filed on Nov. 8, 2007, now Pat. No. 7,760,574, and a division of application No. 11/067,095, filed on Feb. 25, 2005, now Pat. No. 7,864,615.

(51) Int. Cl.
*G11C 5/14* (2006.01)
(52) U.S. Cl. ........................................ 365/226
(58) Field of Classification Search .............. 365/185.18, 365/226; 711/103
See application file for complete search history.

(56) References Cited

U.S. PATENT DOCUMENTS

| 5,797,024 | A  | * | 8/1998 | Gochi ........................... 713/340 |
| 6,288,526 | B1 | * | 9/2001 | Olah ............................. 323/316 |
| 7,092,308 | B2 | * | 8/2006 | Choi et al. ...................... 365/226 |
| 2005/0024128 | A1 | * | 2/2005 | Pasternak ....................... 327/541 |
| 2005/0041509 | A1 | * | 2/2005 | Kumahara et al. ............. 365/226 |
| 2005/0050235 | A1 |   | 3/2005 | Choi |
| 2005/0141317 | A1 | * | 6/2005 | Kim et al. ...................... 365/226 |

* cited by examiner

*Primary Examiner* — Anh Phung
*Assistant Examiner* — Douglas King
(74) *Attorney, Agent, or Firm* — Sawyer Law Group, P.C.

(57) ABSTRACT

A Flash memory controller is disclosed. The Flash memory controller comprises a host interface, a Flash memory interface, controller logic coupled between the host interface, the controller logic handling a plurality of voltages. The controller also includes a mechanism for allowing a multiple voltage host to interface with a high voltage or a multiple voltage Flash memory. A multiple voltage Flash memory controller in accordance with the present invention provides the following advantages over conventional Flash memory controllers: (1) a voltage host is allowed to interface with multiple Flash memory components that operate at different voltages in any combination; (2) power consumption efficiency is improved by integrating the programmable voltage regulator, and voltage comparator mechanism with the Flash memory controller; (3) External jumper selection is eliminated for power source configuration; and (4) Flash memory controller power source interface pin-outs are simplified.

9 Claims, 8 Drawing Sheets

FLASH MEMORY CONTROLLER UTILIZING MULTIPLE VOLTAGES AND A METHOD OF USE

CROSS REFERENCE

Under 35 U.S.C. 120, this application is a divisional application and claims priority to U.S. application Ser. No. 11/067,095 filed on Feb. 25, 2005, entitled Flash Memory Controller Utilizing Multiple Voltages and a Method of Use, all of which is incorporated herein by reference as well as U.S. application Ser. No. 11/937,451 filed on Nov. 8, 2007, entitled Flash Memory Controller Utilizing Multiple Voltages and a Method of Use.

FIELD OF THE INVENTION

The present invention relates generally to Flash memory controllers and more specifically to a Flash memory controller that utilizes multiple voltages.

BACKGROUND OF THE INVENTION

A traditional Flash memory storage device, such as an SD card, MMC, USB, Compact Flash (CF) or Memory Stick (MS), operates at a fixed voltage level of 3.3 volts. As mobile communication host devices, such as PDAs and cell phones, proliferate in the market place, a voltage level of power supply to 1.8 volts is needed in order to conserve battery power dissipation. Dual voltage power sources provide a challenge for an intelligent Flash memory controller. The role of the Flash memory controllers is to provide a seamless interface between any combination of host devices, PCs, PDAs or cell phones, and the Flash memory components residing inside Flash memory storage devices.

FIG. 1 is a block diagram of a conventional Flash memory storage device 50, that consists of a host interface 27, a dual voltage Flash memory controller 20, a Flash memory component 51, and a Flash interface 24. It works through a host device interface 27 with a host device 10. There are six interface combinations between host device 10 and Flash memory 51 as illustrated in List 1 and Table 1.

List 1:
(a) High voltage host and high voltage Flash memory.
(b) Low voltage host and high voltage Flash memory.
(c) Dual voltage host and high voltage Flash memory.
(d) High voltage host and dual voltage Flash memory.
(e) Low voltage host and dual voltage Flash memory.
(f) Dual voltage host and dual voltage Flash memory.

TABLE 1

|  | Flash Memory 3.3 V | Flash Memory 1.8 V/3.3 V |
| --- | --- | --- |
| Host Device 3.3 V | Interface combination (a) | Interface combination (d) |
| Host Device 1.8 V | Interface combination (b) | Interface combination (e) |
| Host Device 1.8 V/3.3 V | Interface combination (c) | Interface combination (f) |

A high voltage host is a host device 10 such as a PC, PDA or cell phone that operates at a single fixed voltage, normally at 3.3 volts. A low voltage host is a host device 10 such as a PDA or cell phone that operates at a single fixed voltage, normally at 1.8 volts. A dual voltage host is a host device 10 such as a PC, PDA or cell phone that can interface with a Flash memory storage device 50 at either a high voltage of 3.3 volts or a low voltage of 1.8 volts, on demand.

A high voltage Flash memory is a Flash memory component 51 that operates at a single fixed voltage, normally at 3.3 volts. It is commonly referred to as a 3.3V Flash memory. A dual voltage Flash memory is Flash memory component 51 that can operate at either a high voltage of 3.3 volts or a low voltage of 1.8 volts, on demand. It is commonly referred to as a 1.8V Flash memory. Even though a dual voltage Flash memory can operate at either voltage, it is beneficial to operate at a low voltage level of 1.8 volt for lower power consumption.

The conventional dual voltage Flash memory controller 20 includes a step-down voltage regulator 25 to provide for a low voltage of 1.8 volts. It is used as a power source for Flash memory 51 as well as for Flash I/O buffer 23. Through proper jumper connection of nodes A 41, B 42, C 43, D 44, E 45 and F 46, it is possible to address all combinations mentioned above, except interface combination (b) which is a low voltage. Accordingly, a host device interfacing with a high voltage memory device means that a low voltage host device 10 can only interface with a dual voltage Flash memory 51, instead of a more available high voltage one.

Nodes A 41, B 42 and C 43 form one jumper set. It functions as a single pole/double-throw power switch with node B 42 as the center pole. Nodes D 44, E 45 and F 46 form one jumper set. It functions as another singe-pole/double-throw power switch with node E 45 as the center pole. SELECT A-B connects nodes A 41 and B 42. SELECT B-C connects nodes B 42 and C 43. SELECT A-B and SELECT B-C are mutually exclusive. SELECT D-E connects nodes D 44 and E 45. SELECT E-F connects nodes E 45 and F 46. SELECT D-E and SELECT E-F are mutually exclusive.

As dual voltage Flash memory availability is heavily dependent on more advanced semiconductor process technology, it is important to provide an intelligent dual voltage Flash memory controller that is able to interface with any Flash memory component, be it dual voltage, high voltage or low voltage.

Referring again to FIG. 1, the conventional dual voltage Flash memory controller 20 includes a host interface 27, host IO buffer 21, kernel control logic 22, Flash IO buffer 23, step-down voltage regulator 25 and Flash interface 24. The memory controller 20 has various interface pads VCCIN IOH 31, VCCIN_H 32, VCCIN_K 35, VCCIN_IOF 36, VCCOUT_F 33, and VCCOUT_K 34 for power input and output. VCCIN_ IOH 31 is the power input to host I/O buffer 21. This pad is always connected to the power output of host device 10 power interface. VCCIN_H 32 is the power input to step-down voltage regulator 25. VCCIN_K 35 is the power input to kernel controller logic 22. VCCIN_IOF 36 is the power input to Flash I0 buffer 23. This pad is always connected to power input VCCIN_F 52 to Flash memory 51. VCCOUT_F 33 is the power output of 1.8 volts from step-down 25, intended for Flash memory 51. VCCOUT_K 34 is the power output of 1.8 volts from step-down voltage regulator 25, intended for kernel controller logic 22.

The power source of VCCIN_F 52 and VCCIN JOF 36 is connected to node B 42 of a three-pin jumper set. One end of the jumper set is node A 41, which is connected to the power interface of host device 10. Another node C 43 is connected to VCCOUT_F 33. The two exclusiveiumper combinations of SELECT A-B and SELECT B-C are used to select the Flash memory 51 power source of the host device 10 power interface or VCCOUT_F 33 of 1.8V respectively.

Another three-pin jumper set is used to configure the mode of operation of a dual voltage card C (not shown) and to correctly reflect the type of Flash memory 51 installed through node E 45. Node D 44 is connected to the power interface of host device 10. Node F 46 is connected to ground. The two exclusive jumper combinations of SELECT D-E and SELECT E-F are used to select the mode of operation of Flash memory storage device 50 of either DUAL VOLTAGE or HIGH VOLTAGE respectively. Dual voltage mode indicates that a 1.8V Flash memory is used. High voltage mode indicates that a 3.3V Flash memory is used. The reason to have jumper nodes D, E, and F is to allow the Flash memory controller 20 to respond to host device 10 during power-on as to which type of Flash memory component 51 is used, either 1.8V (dual voltage) or 3.3V (high voltage).

FIG. 2 is a flow chart showing how the Flash memory controller 20 responds to a query from the host device 10 after power-on. After power-on, the Flash memory controller waits for command 300 from host device 10. The host device 10 will send voltage query command 301 to Flash memory storage device 50. Flash memory controller 20 responds with correct voltage 302 of Flash memory 51 based on dual voltage card select node E 45 from the jumper set.

If high voltage card mode is returned, the host device 10 will decide if it is able to support the Flash memory storage device 50. If not, the power source from the power interface of host device 10 will be turned off and the Flash memory storage device is disabled. If dual voltage card mode is returned, host device 10 will decide if it is able to provide a 1.8 volts power source to Flash memory storage device 50. If so, it will decide if it should turn off the power source and turn it back on at 1.8 volts 304. If not, the original power source is maintained and the initialization sequence continues. The Flash memory storage device is ready to accept an identification command 305 from the host 10. It is then ready for data transfer 306 from the host device 10.

Referring again to FIG. 1, there are two possible sets of valid jumper combinations as depicted in Table 2 and Table 3 to select the power source feeding into power pad VCCIN IOF 36 of flash I/O buffer 23 and power pad VCCIN_F 52 of Flash memory 51 in FIG. 1.

TABLE 2

| Prior Art (1) | Flash Memory 3.3 V | Flash Memory 1.8 V/3.3 V |
|---|---|---|
| Host Device 3.3 V | SELECT A-B SELECT E-F | SELECT B-C SELECT D-E |
| Host Device 1.8 V | NOT ALLOWED | SELECT B-C SELECT D-E |
| Host Device 1.8 V/3.3 V | SELECT A-B SELECT E-F | SELECT B-C SELECT D-E |

Where:
SELECT A-B: Connect jumper nodes A and B.
SELECT B-C: Connect jumper nodes B and C.
SELECT D-E: Connect jumper nodes D and E.
SELECT E-F: Connect jumper nodes E and F.
SELECT G-H: Connect jumper nodes G and H.
SELECT H-I: Connect jumper nodes H and I. The combination labeled "NOT ALLOWED" corresponds to interface combination (b) in List 1.

TABLE 3

| Prior Art (2) | Flash Memory 3.3 V | Flash Memory 1.8 V/3.3 V |
|---|---|---|
| Host Device 3.3 V | SELECT A-B SELECT E-F | SELECT A-B SELECT D-E |

TABLE 3-continued

| Prior Art (2) | Flash Memory 3.3 V | Flash Memory 1.8 V/3.3 V |
|---|---|---|
| Host Device 1.8 V | NOT ALLOWED | SELECT A-B SELECT D-E |
| Host Device 1.8 V/3.3 V | SELECT A-B SELECT E-F | SELECT A-B SELECT D-E |

With a single step-down voltage regulator, the conventional Flash memory controller does not allow a 1.8V host device to interface with a 3.3V Flash memory, as shown in Table 2 and Table 3.

Accordingly, what is needed is a Flash memory controller that provides the following features: (a) allows a host to interface with a plurality of Flash memory components of different voltages in any combination; (b) improves power consumption efficiency; (c) eliminates external jumper selection for power source configuration; and (d) simplifies Flash memory controller power source interface pin-outs. The present invention addresses such a need.

SUMMARY OF THE INVENTION

A Flash memory controller is disclosed. The Flash memory controller comprises a host interface, a Flash memory interface, controller logic coupled between the host interface, the controller logic handling a plurality of voltages. The controller also includes a mechanism for allowing a multiple voltage host to interface with a high voltage or a multiple voltage Flash memory.

A multiple voltage Flash memory controller in accordance with the present invention provides the following advantages over conventional Flash memory controllers: (1) a voltage host is allowed to interface with multiple Flash memory components that operate at different voltages in any combination through the use of a programmable voltage regulator and a voltage comparator; (2) power consumption efficiency is improved by integrating the programmable voltage regulator and voltage comparator mechanism with the Flash memory controller; (3) External jumper selection is eliminated for power source configuration through the above-identified integration; and (4) Flash memory controller power source interface pin-outs are simplified by eliminating redundant power source interface pin outs.

BRIEF DESCRIPTION OF THE DRAWINGS

FIG. 2 is a flow chart showing how the Flash memory controller shall respond to query from host device after power on.

FIG. 4 is a flow chart showing how the Flash memory controller shall respond to query from host device after power on.

FIG. 6 is a flow chart showing how the intelligent dual voltage Flash memory controller shall respond to query from host device after power on.

DETAILED DESCRIPTION

The present invention relates generally to Flash memory controllers and more specifically to a Flash memory controller that utilizes multiple voltages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A multiple voltage Flash memory controller in accordance with the present invention provides the following features:

(a) Allows a voltage host to interface with multiple Flash memory components that operate at different volumes in any combination.
(b) Improves power consumption efficiency.
(c) Eliminates external jumper selection for power source configuration.
(d) Simplifies Flash memory controller power source interface pin-outs.

A system and method in accordance with the present invention is described in the context of a dual voltage Flash memory controller; however, one of ordinary skill in the art readily recognizes that the system could be utilized in a variety of environments which include multiple voltages. In addition, although specific voltages are discussed a variety of voltages could be utilized and their use would be within the spirit and scope of the present invention.

Figure 1:
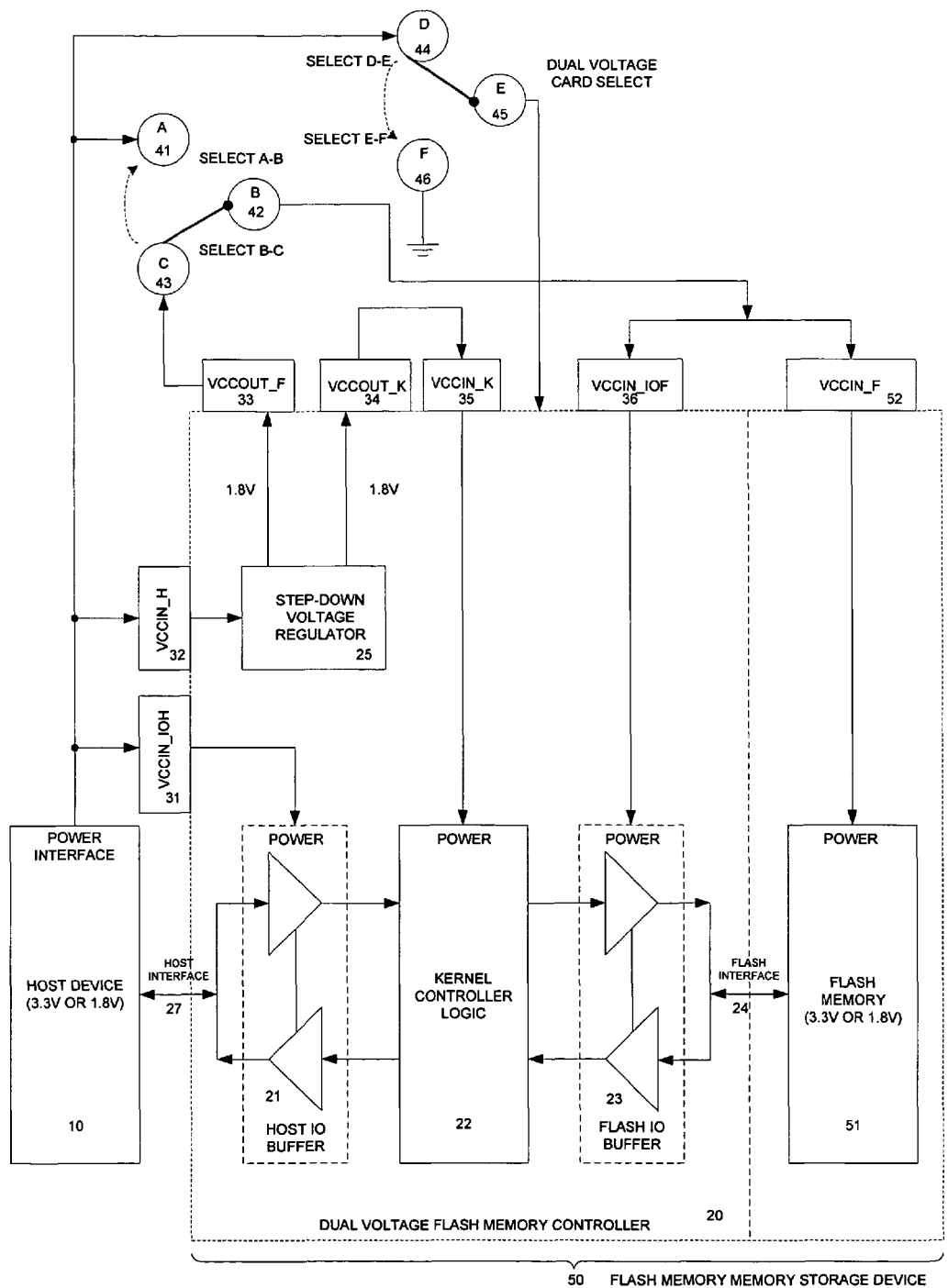
FIG. 1 is a block diagram of a conventional Flash memory storage device.
Figure 2:
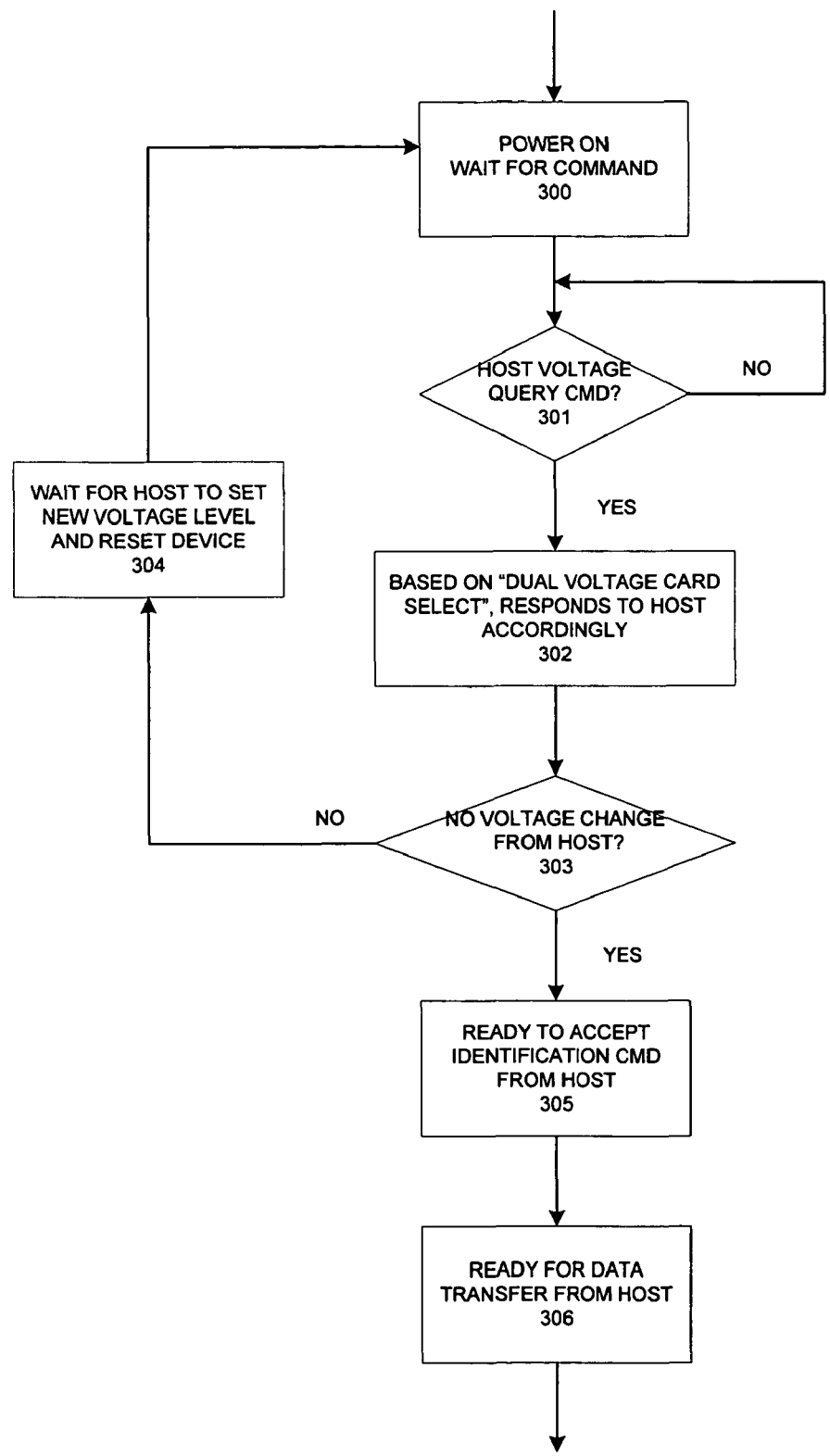
Figure 3:
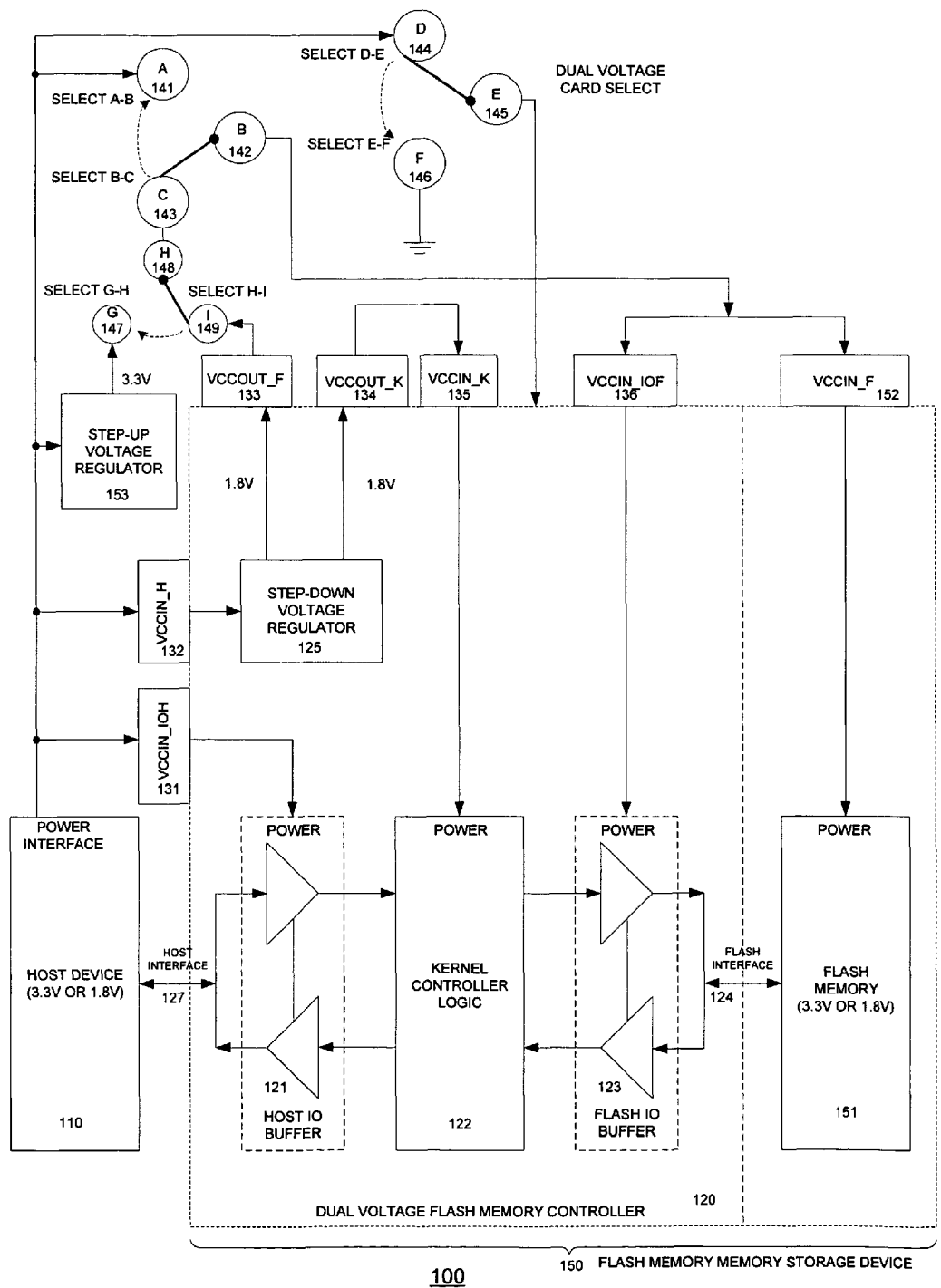
FIG. 3 is a block diagram of a first embodiment of dual voltage Flash memory controller in accordance with the present invention.

FIG. 3 is a block diagram of a first embodiment of a dual voltage Flash memory controller system in accordance with the present invention. The system 100 comprises a host interface 127, a dual voltage Flash memory controller 120, a step-up voltage regulator 153 and three sets of jumper settings (A, B, C), (D, E, F) and (G, H, I). In addition, it interfaces with a Flash memory component 151, and a Flash interface 124.

By adding a separate step-up voltage regulator 153 and a set of jumper settings (G 147, H 148, and I 149) in FIG. 3, the interface combination (b), i.e., in Table 1, Table 2 and Table 3 is supported. It therefore achieves the objective of (a) allowing a high, low or dual voltage host to interface with a high or dual voltage Flash memory component in any combination.

When the Flash memory card is first manufactured, Flash memory type is determined as either 3.3V or dual voltage. But the host device type can not be known until the Flash memory card is actually plugged into the host. As shown in Table 2 or Table 3, the column-wise jumper settings corresponding to a particular Flash memory type should stay the same. This means that column entries of interface combinations in Table 1 should be identical. Table 4 shows a possible jumper setting combination to select a power source feeding into power pad VCCIN IOF 136 of Flash I/O buffer 123 and power pad VCCIN_F 152 of Flash memory 51 in FIG. 3.

TABLE 4

| Invention (1) | Flash Memory 3.3 V | Flash Memory 1.8 V/3.3 V |
|---|---|---|
| Host Device 3.3 V | SELECT B-C SELECT D-E SELECT G-H | SELECT B-C SELECT D-E SELECT H-I |
| Host Device 1.8 V | SELECT B-C SELECT D-E SELECT G-H | SELECT B-C SELECT D-E SELECT H-I |

TABLE 4-continued

| Invention (1) | Flash Memory 3.3 V | Flash Memory 1.8 V/3.3 V |
|---|---|---|
| Host Device 1.8 V/3.3 V | SELECT B-C SELECT D-E SELECT G-H | SELECT B-C SELECT D-E SELECT H-I |

Figure 4:
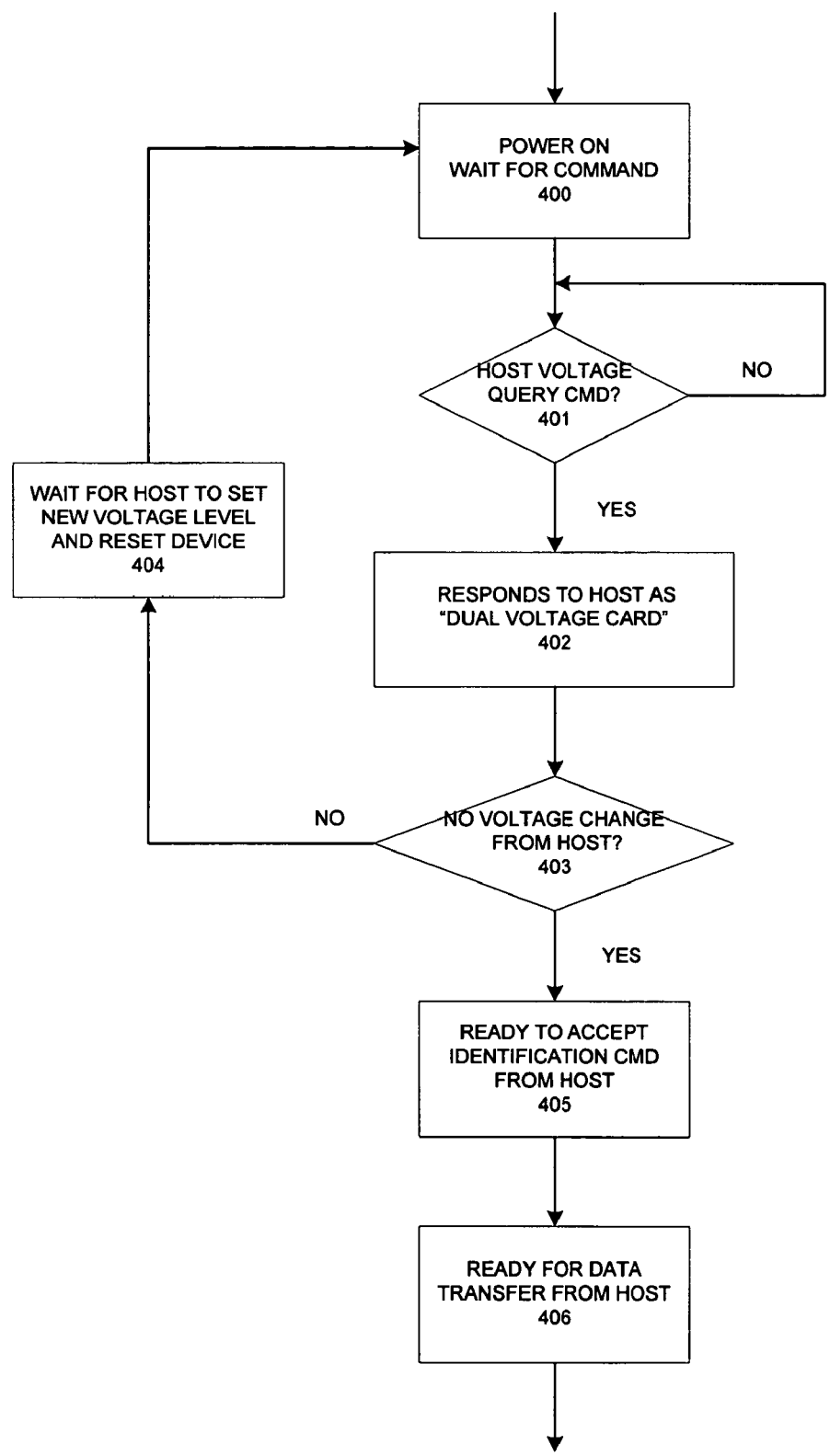

FIG. 4 is a flow chart showing how the Flash memory controller 120' in the invention responds to a query from host device 110 after power-on in accordance with the embodiment illustrated in/according to the invention in FIG. 3. After power-on, Flash memory controller 120' waits for command 400 from host device 110. Host device 110 will send voltage query command 301 to Flash memory storage device 150. Flash memory controller 120' responds with "dual voltage card" mode 402 to the host device 110.

After receiving "dual voltage card" mode from Flash memory controller 120', host device 110 will decide if it is able to provide a 1.8 volt power source to Flash memory storage device 150. If so, it will decide if it should turn off the power source and turn it back on at 1.8 volts 404. If not, the original power source is maintained and the initialization sequence continues. The Flash memory storage device is ready to accept an identification command 405 from host 110. It is then ready for data transfer 406 from host device 110.

Due to this "same column-wise jumper setting" constraint, some interface combination entries in the table are not as efficient as possible and therefore result in more power consumption than is necessary.

In case of interface combinations (e) and (f) in Table 4, the power source of Flash memory comes from the host device directly, instead of from step-down voltage regulator 125 in FIG. 3. On the column under Flash memory 1.8V/3.3V in Table 4, there are two types of entries: interface combination (d) for 3.3 volt host devices and interface combinations (e) and (f) for 1.8 volt host devices. Since there is no intelligent control on jumper settings, these three entries of interface combinations (d), (e) and (f) have to be identical.

By adding intelligent control to jumper settings, the present invention is able to have more fine-tuned power source selection as shown in Table 5. Table 5 is an optimized interface combination table corresponding to Table 4. It is to select power source feeding into power pad VCCIN IOF 136 of flash IO buffer 123 and power pad VCCIN F 152 of Flash memory 151 in FIG. 5.

TABLE 5

| Invention (2) | Flash Memory 3.3 V | Flash Memory 1.8 V/3.3 V |
|---|---|---|
| Host Device 3.3 V | SELECT A-B SELECT E-F | SELECT B-C SELECT D-E SELECT H-I |
| Host Device 1.8 V | SELECT B-C SELECT D-E SELECT G-H | SELECT A-B SELECT E-F |
| Host Device 1.8 V/3.3 V | SELECT A-B SELECT E-F | SELECT A-B SELECT E-F |

The jumper settings of FIG. 3, A 141, B 142, C 143, D 144, E 145, F 146, G 147, H 148 and I 149 are changed to digitally controllable switches that are able to configure in any combination on demand.

Figure 5:
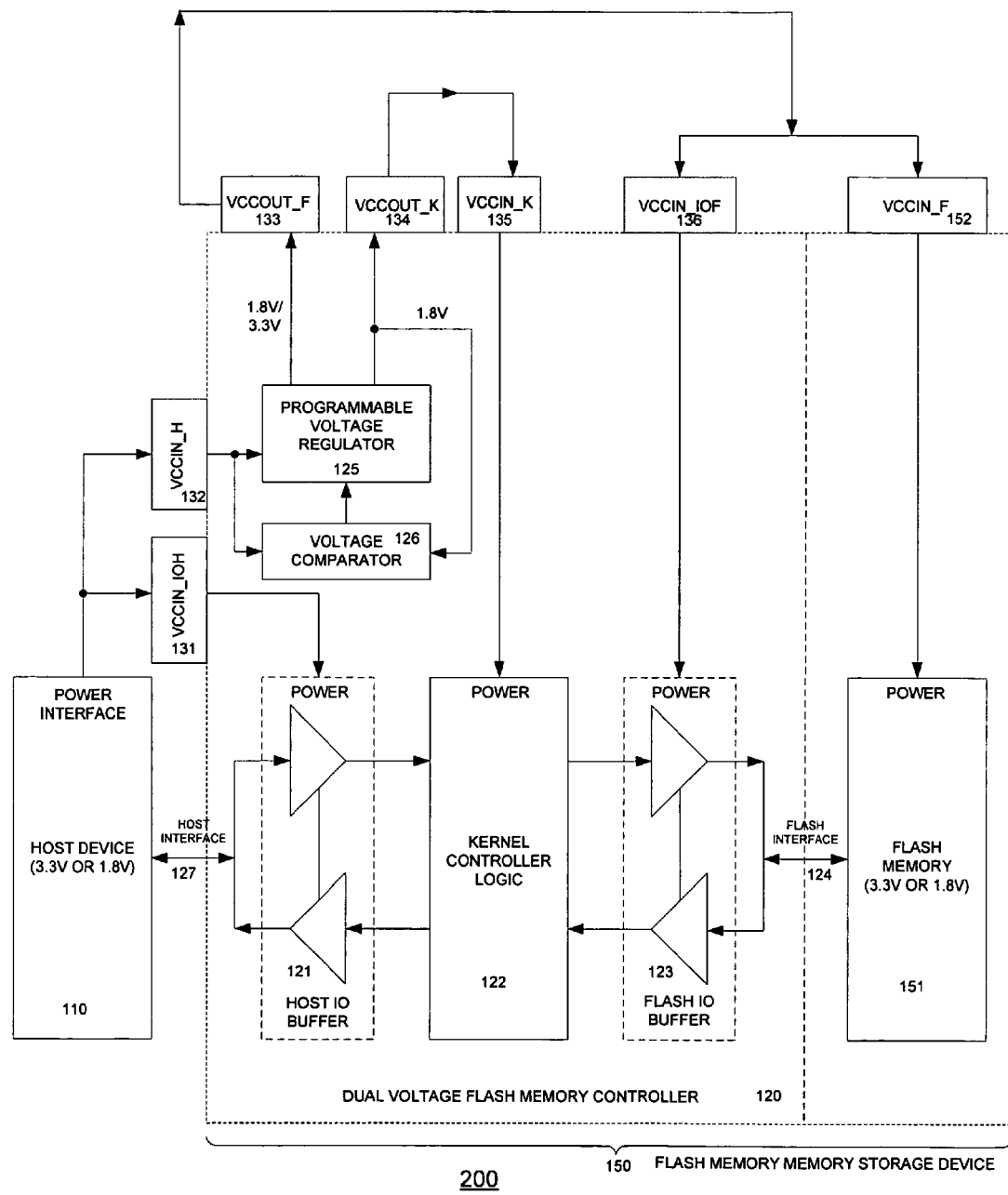
FIG. 5 is a second embodiment of a dual voltage Flash memory controller in accordance with the present invention.

FIG. 5 is a block diagram of a second embodiment of a Flash memory controller system in accordance with the present invention. In this embodiment a voltage comparator

126 and programmable voltage regulator 125 are integrated into dual voltage Flash memory controller 120. In so doing the Flash memory controller system is a standalone system.

Figure 6:
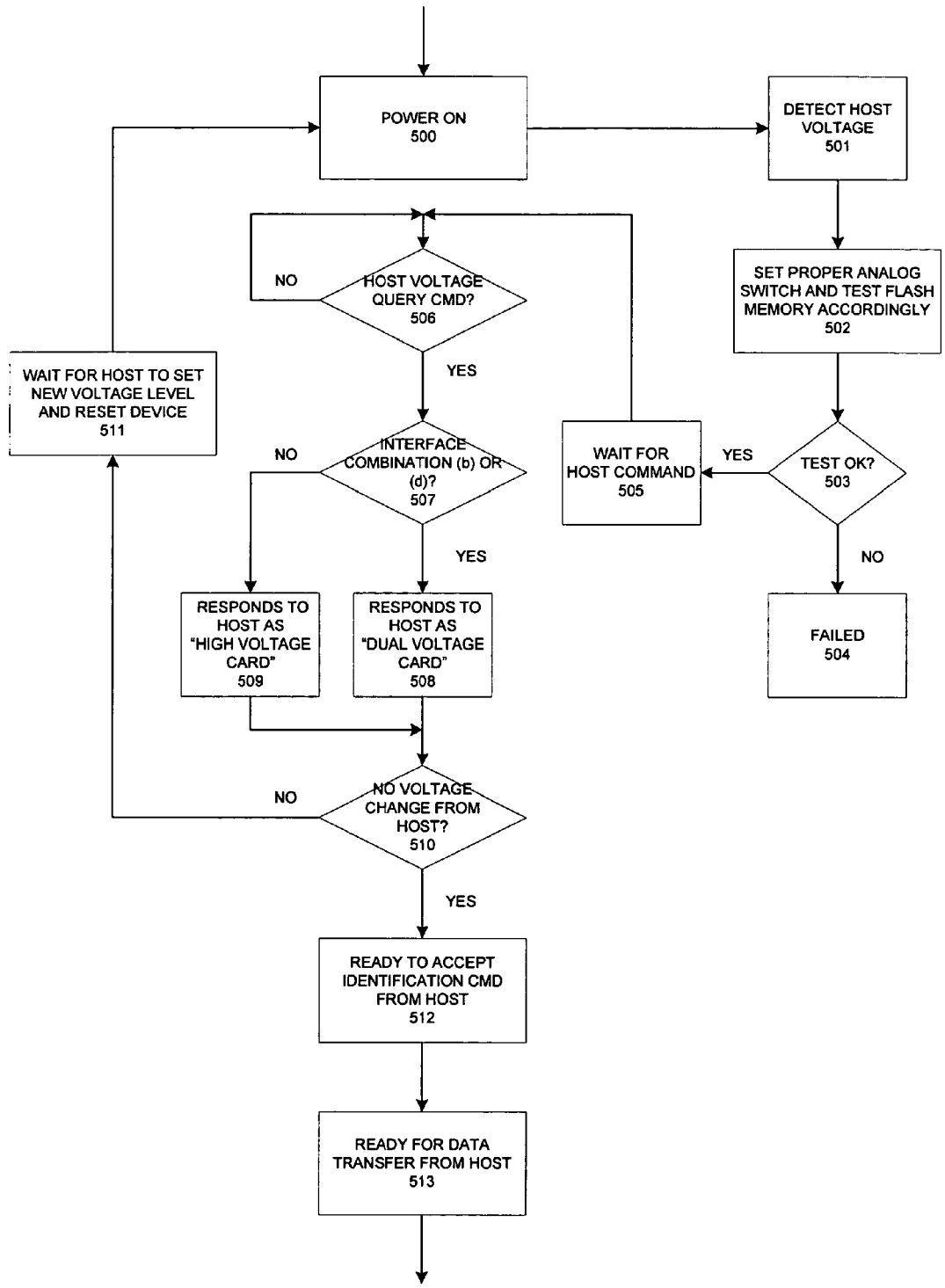

FIG. 6 is a flow chart showing how the intelligent dual voltage Flash memory controller 120 in the invention responds to a query from host device 110 after-power on according to invention FIG. 5. After power-on 500, Flash memory controller 120 detects host voltage 501 through voltage comparator 126. It then sets the proper power switches and tests Flash memory.

Figure 7:
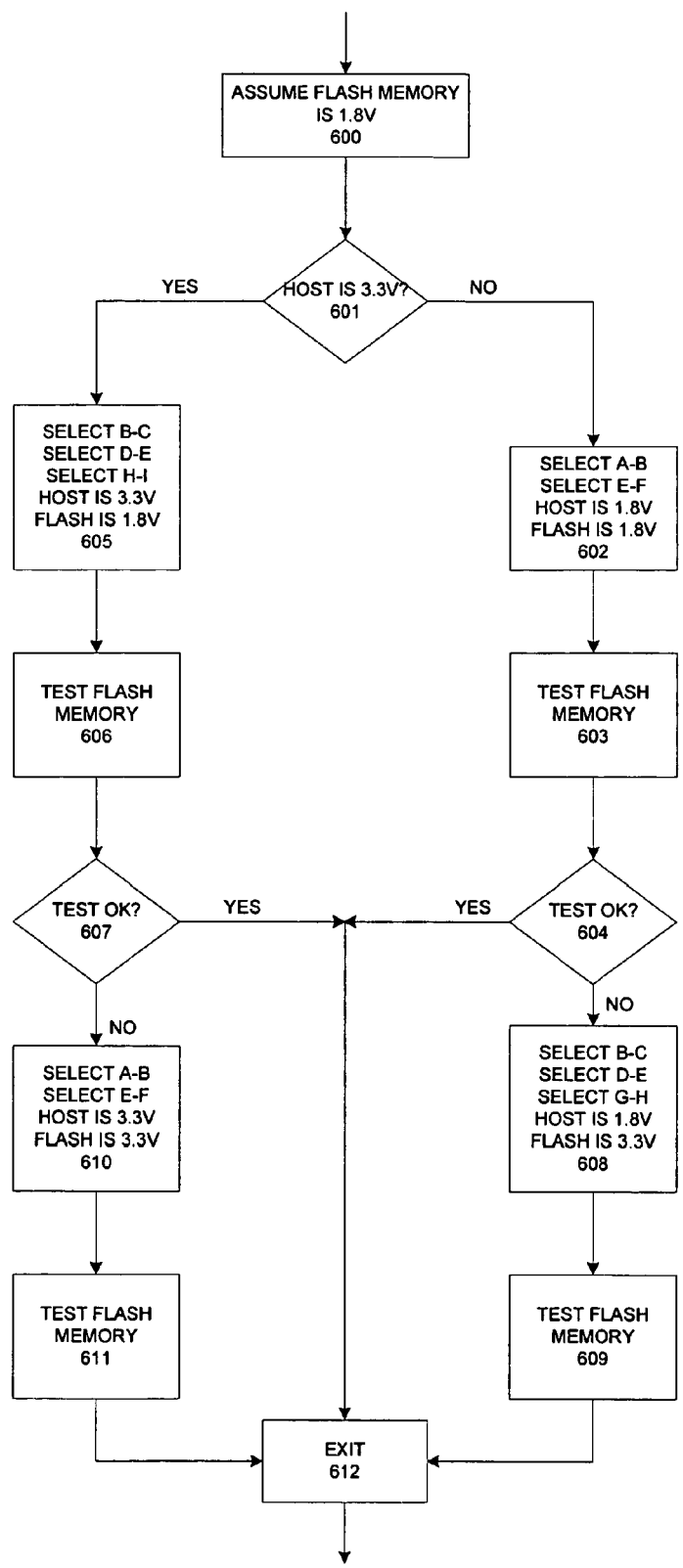
FIG. 7 is a flow chart for setting proper power switches and testing Flash memory accordingly.

FIG. 7 is a flow chart for setting proper power switches and testing Flash memory accordingly. It first assumes that Flash memory is capable of operating at 1.8 volts 600. It checks the voltage comparator if host device 110 is supplying voltage at 3.3 volt 601? If so, SELECT B-C, SELECT D-E and SELECT H-I power switches are set and the host device is set at 3.3 volts while Flash memory is set at 1.8 volts 605. A test Flash memory operation is conducted 606. If the test result is OK 607, then exit flow chart 612. Otherwise, set power switches SELECT A-B and SELECT E-F and set the host device 110 to 3.3 volts and Flash memory to 3.3 s volt 610. A test Flash memory operation is conducted 611 afterwards. Then, exit flowchart 612.

If the host device is supplying voltage at 1.8 volts 601, SELECT A-B, and SELECT E-F power switches are set and the host device is set at 1.8 volts while Flash memory is set at 1.8 volts 602. A test Flash memory operation is conducted 603. If the test result is OK 604, then exit flow chart 612. Otherwise, set power switches SELECT B-C, SELECT D-E and SELECT G-H and set the host device 110 to 1.8 volts and Flash memory to 3.3 volts 608. A test Flash memory operation is conducted 609 afterwards. Then, exit flowchart 612.

After exiting flowchart 612, check if the test result is OK 503? If no, Flash memory storage device fails 504. If OK, wait for host command 505. Check if host voltage query command is received 506? If no, continue waiting 506. If yes, check if host device 110 and Flash memory 151 are one of interface combinations (b) or (d)? If so, respond to host device 110 as "dual voltage card" 508. Otherwise, respond to the host device as "high voltage card" 509.

After receiving "dual voltage card" mode from Flash memory controller 120, host device 110 will decide if it is able to provide a 1.8 volts power source to Flash memory storage device 150. If so, it will decide if it should turn off the power source and turn it back on at 1.8 volts 511. The Flash memory controller resumes power on state 500. If the original power source is maintained, there is no voltage change from host device 110 and the initialization sequence continues. Flash memory storage device 150 is ready to accept identification command 512 from host device 110. It is then ready for data transfer 513 from host device 10.

Comparing Table 4 and Table 5, interface combinations (a), (c), (e) and (f) supply a power source directly from the host device to Flash memory. The Flash memory controller can turn off the internal voltage regulator 125. It results in power saving and thus achieves objective (b) of improving power consumption efficiency.

Another benefit of the intelligent Flash memory controller is that the "dual voltage card" switch is no longer necessary, as it can be determined by software. All other jumper settings for voltage source selection can be replaced with programmable power switches (not shown) inside Flash memory controller 120, thereby resulting in no external jumper setting and achieving objective (c) of eliminating the external jumper selection for power source configuration.

As part of the requirement of dual voltage Flash memory controller 150 in FIG. 5, the power source VCCIN IOH 131 of host 10 buffer 121 shall always be the same or corresponding to the power source VCC1N_H of programmable voltage regulator 125 and voltage regulator 126. The power source VCCIN_K of kernel controller logic 122 shall always be the same or corresponding to kernel voltage output VCCOUT_K 134. The power source VCCIN_IOF 136 of Flash I/O buffer 123 shall always be the same or corresponding to the power source VCCIN_F 52 of Flash memory 151 and Flash memory voltage output VCCOUT_F 133. The four redundant pads of VCCIN_H 132, VCCOUT K 134, VCCIN K 135 and VCCIN_IOF 136 can be routed internally inside dual voltage Flash memory controller 120.

Figure 8:
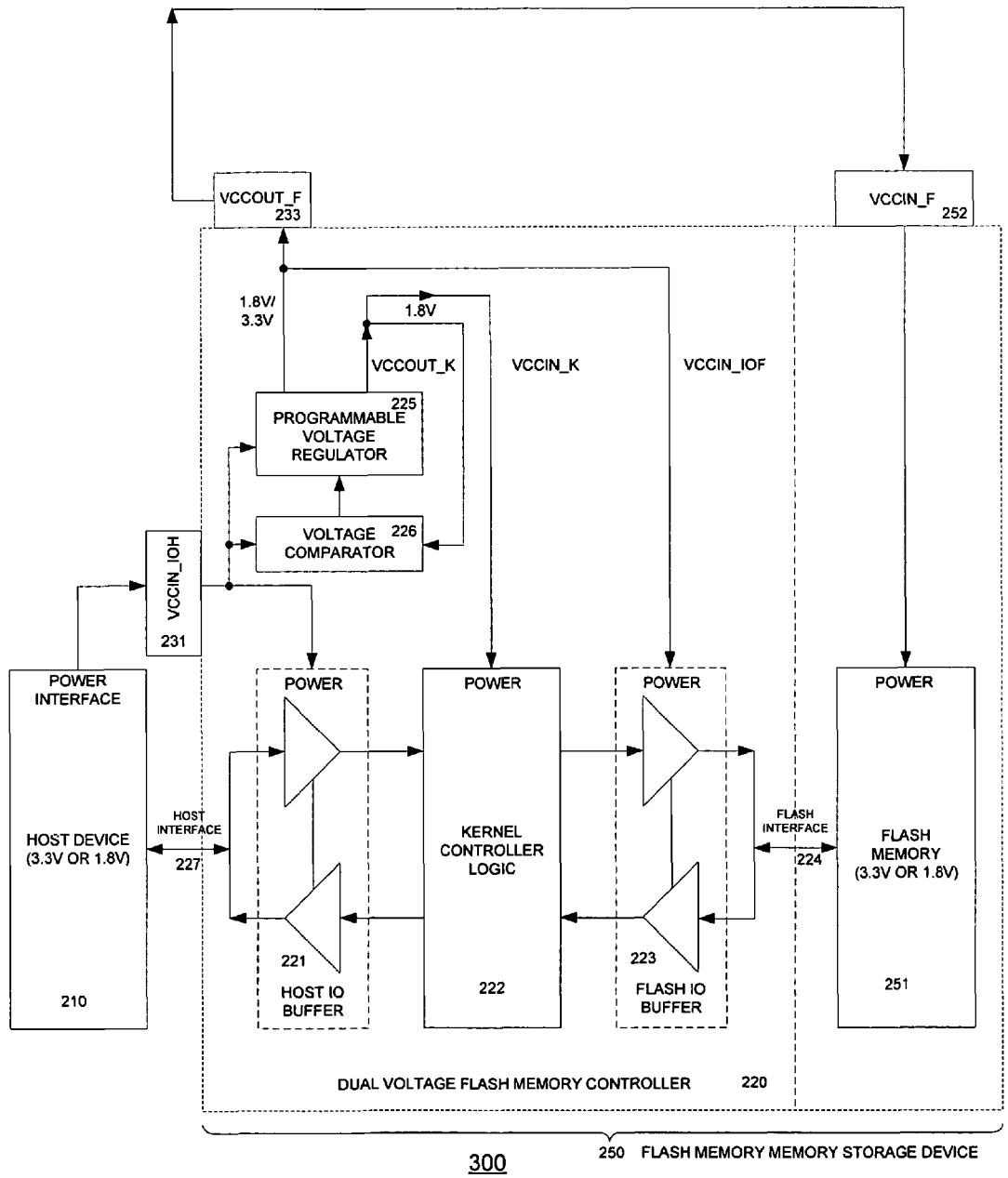
FIG. 8 is a third embodiment of a Flash memory controller in accordance with the present invention.

FIG. 8 is a block diagram of a third embodiment of a Flash memory controller system in accordance with the present invention. In this embodiment FIG. 8 has only one input power source pad VCCIN IOH 231 and one output power source pad VCCOUT F 233 is needed and therefore the power source interface pin-outs are simplified. It achieves the objective (d) of simplifying Flash memory controller power source interface pin-outs.

A multiple voltage Flash memory controller in accordance with the present invention provides the following advantages over conventional Flash memory controllers: (1) a voltage host is allowed to interface with multiple Flash memory components that operate at different voltages in any combination through the use of a programmable voltage regulator and a voltage comparator; (2) power consumption efficiency is improved by integrating the programmable voltage regulator and voltage comparator mechanism with the Flash memory controller; (3) external jumper selection is eliminated for power source configuration through the above-identified integration; and (4) Flash memory controller power source interface pin-outs are simplified by eliminating redundant power source interface pin outs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A Flash memory controller comprising:
a host interface;
a Flash memory interface; and
controller logic coupled between the host interface and the Flash memory interface; the controller logic handling a plurality of voltages; and
a mechanism for allowing a multiple voltage host to interface with a high voltage and a multiple voltage Flash memory, wherein the mechanism comprises a step-down voltage regulator, a step-up voltage regulator, a voltage comparator and a plurality of digitally controllable switches connected to the Flash memory interface and capable of being intelligently controlled on demand to alter connections between the step-up voltage regulator, the step-down voltage regulator, the host device and the Flash memory such that a multiple voltage host is allowed to interface with a high voltage Flash memory and a multiple voltage Flash memory.

2. The controller of claim 1 wherein the high voltage is 3.3 volts and a low voltage is 1.8 volts.

3. The controller of claim 1 wherein the mechanism comprises a voltage comparator and a programmable voltage regulator, wherein the voltage comparator and the programmable voltage regulator are integrated with the controller, wherein external jumper selections are eliminated.

4. The controller of claim 1 which includes a multiple voltage and card switch for setting the jumper settings.

5. A Flash memory controller system comprising:
a Flash memory controller; and
a step-down voltage regulator, a step-up voltage regulator, a voltage comparator and a plurality of digitally controllable switches connected to a Flash memory interface of the Flash memory controller and capable of being intelligently controlled on demand to alter connections between the step-up voltage regulator, the step-down voltage regulator, the host device and the Flash memory such that a multiple voltage host is allowed to interface with a high voltage Flash memory and a multiple voltage Flash memory.

6. The controller system of claim 5 wherein the high voltage is 3.3 volts and the low voltage is 1.8 volts.

7. A Flash memory controller comprising:
a host interface;
a Flash memory interface;
controller logic coupled to the host interface and the Flash memory interface; and
a mechanism for allowing a dual voltage host to interface with a high voltage and a dual voltage Flash memory, wherein the mechanism comprises a step-down voltage regulator, a step-up voltage regulator, a voltage comparator and a plurality of digitally controllable switches coupled to the Flash memory interface and capable of being intelligently controlled on demand to alter connections between the step-up voltage regulator, the step-down voltage regulator, the host device and the Flash memory such that a multiple voltage host is allowed to interface with a high voltage Flash memory and a multiple voltage Flash memory.

8. The controller of claim 7 wherein the dual voltage comprises a high voltage of 3.3 volts and a low voltage of 1.8 volts.

9. The controller of claim 7 which includes a dual voltage card switch for setting the jumper settings.

* * * * *